United States Patent
Janardhanan et al.

(10) Patent No.: US 10,516,401 B2
(45) Date of Patent: Dec. 24, 2019

(54) WOBBLE REDUCTION IN AN INTEGER MODE DIGITAL PHASE LOCKED LOOP

(71) Applicant: TEXAS INSTRUMENTS INCORPORATED, Dallas, TX (US)

(72) Inventors: Jayawardan Janardhanan, Issaquah, WA (US); Eric Paul Lindgren, Bonney Lake, WA (US); Henry Yao, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/214,179

(22) Filed: Dec. 10, 2018

(65) Prior Publication Data

US 2019/0280649 A1    Sep. 12, 2019

Related U.S. Application Data

(60) Provisional application No. 62/640,601, filed on Mar. 9, 2018.

(51) Int. Cl.
*H03L 7/081* (2006.01)
*H03L 7/10* (2006.01)

(52) U.S. Cl.
CPC .............. *H03L 7/081* (2013.01); *H03L 7/104* (2013.01)

(58) Field of Classification Search
CPC . H03L 7/081–0814; H03L 7/10; H03L 7/104; H03L 7/107; H03L 7/18
See application file for complete search history.

(56) References Cited

U.S. PATENT DOCUMENTS

| | | |
|---|---|---|
| 5,200,933 A | 4/1993 | Thornton et al. |
| 5,304,954 A | 4/1994 | Saito et al. |
| 5,796,682 A | 8/1998 | Swapp |
| 5,959,502 A | 9/1999 | Ovens et al. |
| 6,308,055 B1 | 10/2001 | Welland et al. |
| 6,310,653 B1 | 10/2001 | Malcolm, Jr. et al. |
| 6,584,574 B1 | 6/2003 | Embree |
| 6,597,249 B2 | 7/2003 | Chien et al. |
| 7,126,429 B2 | 10/2006 | Mitric |

(Continued)

FOREIGN PATENT DOCUMENTS

| | | |
|---|---|---|
| EP | 0644657 | 3/1995 |
| EP | 3182592 | 6/2017 |

(Continued)

OTHER PUBLICATIONS

International Search Report in corresponding PCT Application No. PCT/US2019/021599 dated May 30, 2019 (2 pages).

(Continued)

*Primary Examiner* — Patrick O Neill
(74) *Attorney, Agent, or Firm* — John R. Pessetto; Charles A. Brill; Frank D. Cimino

(57) ABSTRACT

A circuit includes a time-to-digital converter (TDC) to produce an output signal that is a function of a time difference between a first input clock to the TDC and a second input clock to the TDC. A first delay line is also included to add a time delay to a third clock to produce the first input clock. A pseudo random binary sequence generator generates a pseudo random binary bit sequence to be used to vary the amount of time delay added by the first delay line to the third clock.

20 Claims, 5 Drawing Sheets

(56) References Cited

U.S. PATENT DOCUMENTS

| | | |
|---|---|---|
| 7,427,940 B2 | 9/2008 | Staszewski et al. |
| 7,755,439 B2 | 7/2010 | Yu et al. |
| 7,876,136 B2 | 1/2011 | Ha et al. |
| 8,179,174 B2 | 5/2012 | Bunch |
| 8,368,438 B2 | 2/2013 | Furuta |
| 8,957,711 B2 | 2/2015 | Jin et al. |
| 9,020,089 B2 | 4/2015 | Da Dalt |
| 9,490,820 B2 | 11/2016 | Shiozaki |
| 9,634,826 B1 | 4/2017 | Park et al. |
| 9,859,901 B1* | 1/2018 | Chu ................. H03L 7/081 |
| 10,075,173 B2 | 9/2018 | Sarda |
| 10,128,858 B2 | 11/2018 | Goldberg et al. |
| 10,135,452 B2 | 11/2018 | Cherniak et al. |
| 10,141,941 B2 | 11/2018 | Petrov |
| 10,185,349 B2 | 1/2019 | Musunuri et al. |
| 10,193,561 B2 | 1/2019 | Lesso |
| 10,200,047 B2* | 2/2019 | Markulic ............. H03K 5/159 |
| 10,291,214 B2 | 5/2019 | Thijssen et al. |
| 2007/0085570 A1 | 4/2007 | Matsuta |
| 2009/0015338 A1 | 1/2009 | Frey |
| 2009/0219073 A1 | 9/2009 | Sun et al. |
| 2009/0267664 A1 | 10/2009 | Uozumi et al. |
| 2011/0234270 A1 | 9/2011 | Kobayashi |
| 2011/0273210 A1 | 11/2011 | Nagaraj |
| 2012/0056769 A1 | 3/2012 | Wang et al. |
| 2012/0161834 A1 | 6/2012 | Lee et al. |
| 2013/0051290 A1 | 2/2013 | Endo et al. |
| 2014/0225653 A1 | 8/2014 | Nara et al. |
| 2014/0266351 A1 | 9/2014 | Na et al. |
| 2014/0266354 A1 | 9/2014 | Boo et al. |
| 2015/0077279 A1 | 3/2015 | Song et al. |
| 2015/0188553 A1 | 7/2015 | Familia et al. |
| 2015/0372690 A1 | 12/2015 | Tertinek et al. |
| 2016/0056827 A1 | 2/2016 | Vlachoginnakis et al. |
| 2016/0156362 A1 | 6/2016 | Kim et al. |
| 2016/0164532 A1 | 6/2016 | Zhang et al. |
| 2016/0204787 A1 | 7/2016 | Lotfy et al. |
| 2016/0238998 A1 | 8/2016 | Pavlovic et al. |
| 2016/0352506 A1 | 12/2016 | Huang |
| 2016/0380759 A1 | 12/2016 | Kondo et al. |
| 2017/0187383 A1 | 6/2017 | Lesso |
| 2017/0288686 A1 | 7/2017 | Burg et al. |
| 2017/0324416 A1 | 11/2017 | Jakobsson |
| 2018/0269885 A1* | 9/2018 | Kondo ............ H03L 7/0992 |
| 2018/0351558 A1 | 12/2018 | Kuo et al. |

FOREIGN PATENT DOCUMENTS

| | | |
|---|---|---|
| JP | H11143570 | 5/1999 |
| JP | 2009260866 | 11/2009 |
| WO | 2015161890 | 10/2015 |
| WO | 2017174142 | 10/2017 |

OTHER PUBLICATIONS

International Search Report in corresponding PCT Application No. PCT/US2019/021968 dated Jun. 13, 2019 (2 pages).

International Search Report in corresponding PCT Application No. PCT/US2019/021966 dated Jun. 20, 2019 (2 pages).

Michael H. Perrott, "Tutorial on Digital Phase-Locked Loops:" CICC 2009. Sep. 2009 (118 pgs).

Texas Instruments Data Sheet LMK05028 Low-Jitter Dual-Channel Network Synchronizer Clock with EEPROM, Feb. 2018 (94 pages).

International Search Report in corresponding PCT Application No. PCT/US2019/032261 dated Aug. 29, 2019 (2 pages).

International Search Report in corresponding PCT Application No. PCT/US2019/030892 dated Aug. 1, 2019 (3 pages).

* cited by examiner

WOBBLE REDUCTION IN AN INTEGER MODE DIGITAL PHASE LOCKED LOOP

RELATED APPLICATIONS

This application claims priority to U.S. Provisional Application No. 62/640,601, filed Mar. 9, 2018, which is hereby incorporated by reference.

BACKGROUND

A digital phase-locked loop (DPLL) typically includes a time-to-digital converter (TDC) to determine the phase difference between an input reference dock and a feedback dock. The output from the TDC is used to control a voltage or current controlled oscillator (VCO) to maintain the output clock from the DPLL in phase-lock with the respect to the input reference dock.

SUMMARY

In one example, a circuit includes a time-to-digital converter (TDC) to produce an output signal that is a function of a time difference between a first input clock to the TDC and a second input clock to the TDC. A first delay line is also included to add a time delay to a third clock to produce the first input clock. A pseudo random binary sequence generator generates a pseudo random binary bit sequence to be used to vary the amount of time delay added by the first delay line to the third clock.

BRIEF DESCRIPTION OF THE DRAWINGS

For a detailed description of various examples, reference will now be made to the accompanying drawings in which.

DETAILED DESCRIPTION

A TDC has a finite resolution (e.g., 100 ps). In the case of an integer relationship between the VCO output dock frequency and the reference dock and assuming phase lock, the input dock edge and the feedback dock edge always align. As the resolution of the TDC is limited, and the TDC cannot determine the phase difference to a value less than the TDC's resolution, and thus a "dead zone" exists within the TDC's resolution. Due to the dead zone, the output phase may bounce (wobble) between the TDC resolution boundaries. For a TDC resolution of 100 ps, the output phase may wobble between 100 ps and 0 ps as a 100 ps TDC cannot differentiate any finer phase gradations. Such wobble causes an increase in jitter, wander and low frequency noise which detrimentally impacts the performance of the TDC, any DPLL using the TDC and any system that relies on the accuracy of the DPLL.

The examples described herein vary the reference and/or input clock edges. The total delay variation is greater than the resolution of the corresponding TDC. For example, for a 100 ps TDC, the delay may be 150 ps. In some examples, the amount of added delay is pseudorandom. As a result of the added delay, the output signal from the TDC includes noise, which is averaged to a value of close to 0, thereby eliminating, or at least reducing, any wobble. The pseudo random delay can be implemented using a delay line controlled by a multi-bit pseudo random number generator, Additional shaping of the pseudo random delay can be performed as well using a MASH sigma delta noise shaping circuit instead of a pseudo random number generator.

Figure 1:
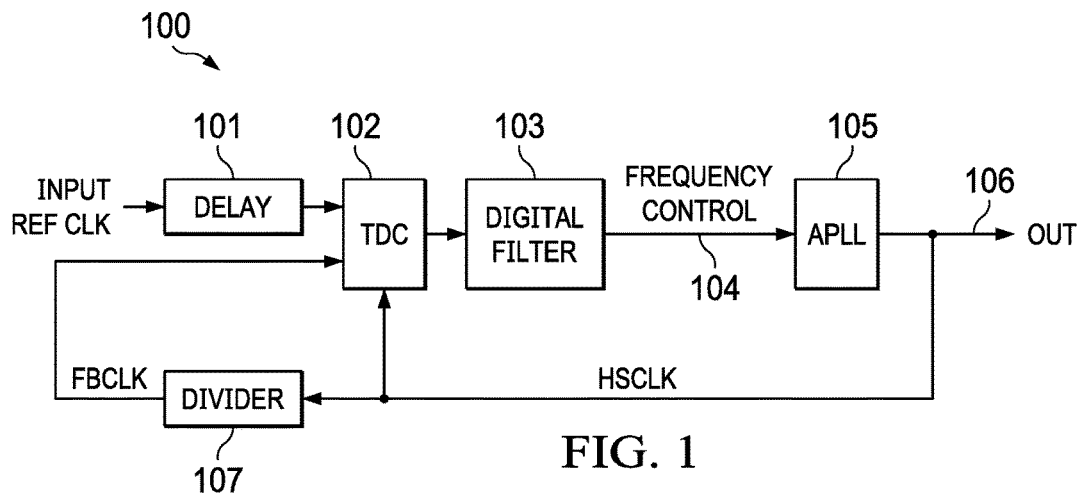
FIG. 1 illustrates a digital phase locked loop including a time-to-digital converter (TDC) in accordance with an example.

FIG. 1 provides an example of the use of a TDC circuit in a digital phase-locked loop (DPLL) 100. The example DPLL 100 of FIG. 1 includes a delay 101, TDC circuit 102, a digital filter 103, an analog phase-locked loop (APLL) 105, and a frequency divider 107. The output signal (OUT) 106 from the APLL is a periodic signal generated by the APLL 105 and phase-aligned to an input reference clock (REF-CLK). The APLL 105 thus is a voltage-controlled oscillator (VCO). The frequency of OUT 106 may be a higher frequency than REFCLK and thus the frequency divider 107 is included to divide down the frequency to match that of the input reference clock. The output signal from the frequency divider 107 is the feedback clock (FBCLK). The TDC circuit 102 functions to determine the time between corresponding edge of the input reference clock and FBCLK from the divider 107. The digital filter 103 filters the TDC's output count value to generate a frequency control signal 104 to adjust the frequency and/or phase of OUT 106 by the APLL 105. The OUT 106 of the APLL 105 also is used as a high-speed clock (HSCLK) to sample the input reference clock and FBCLK. The term "high speed" should not be interpreted as imparting any particular frequency to HSCLK, other than its frequency is generally greater than the frequency of the input reference or feedback clocks. The delay 101 introduces a delay to REFCLK. The implementation and benefit of delay 101 is provided below.

Figure 2:
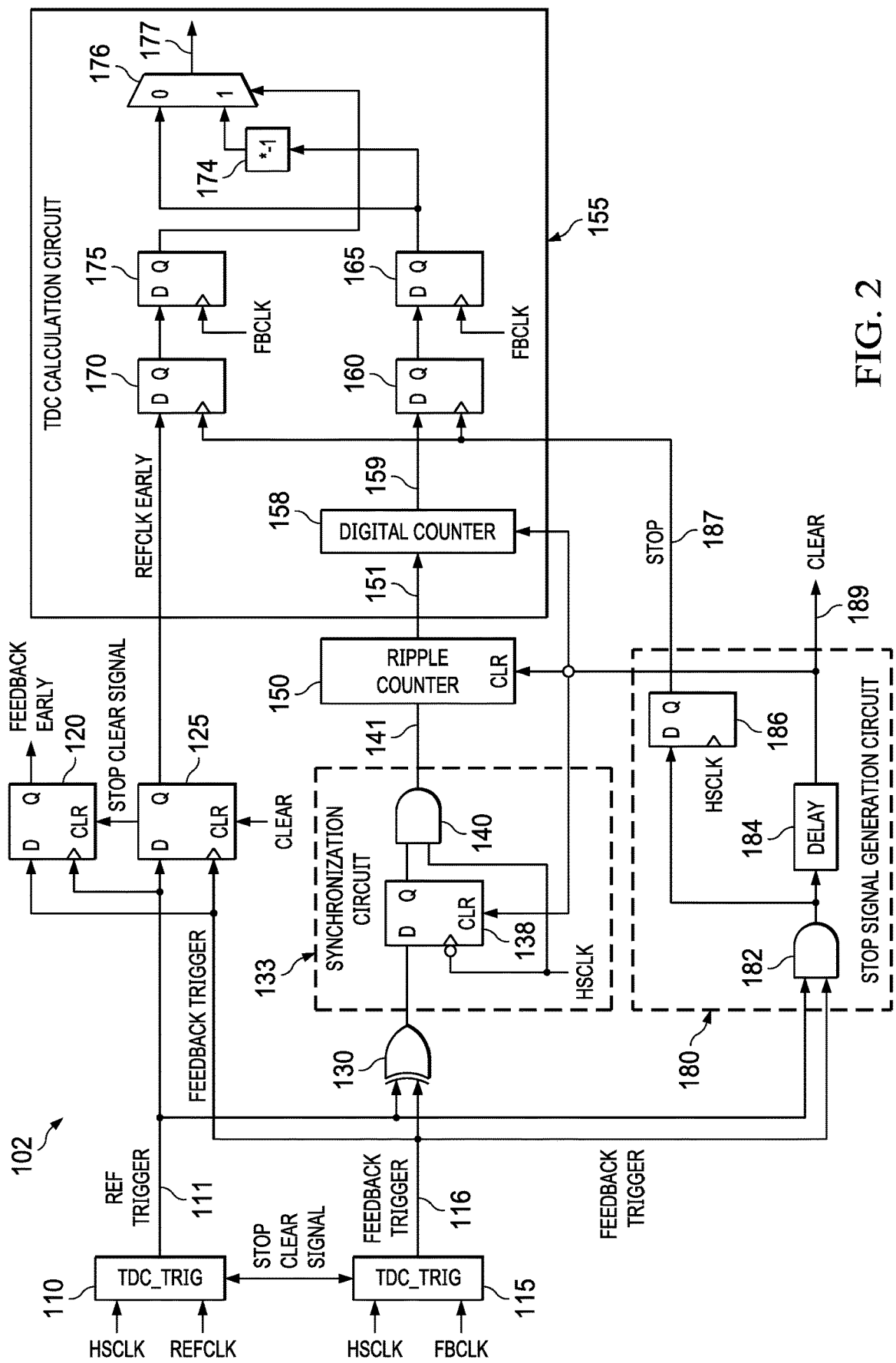
FIG. 2 shows an example circuit implementation of the TDC.

FIG. 2 shows an example of a TDC circuit 102. The disclosed TDC circuit 102 includes TDC trigger circuits (TDC_TRIG) 110 and 115, flip-flops 120 and 125, logic gate 130, synchronization circuit 133, ripple counter 150, TDC calculation circuit 155, and stop signal generation circuit 180. The TDC circuit 102 determines the time difference between corresponding edges of the input reference clock (REFCLK) and the feedback clock (FBCLK). REFCLK is provided to an input of TDC trigger circuit 110 and FBCLK is provided to an input of TDC trigger circuit 115. Another input of each of the TDC trigger circuits 110, 115 is the high-speed clock (HSCLK). Each trigger circuit 110, 115 synchronizes its input signal (REFCLK or FBCLK) to an edge of the HSCLK. The output signal 111 from the TDC trigger circuit 110 is designated as REF Trigger and transitions from low to high (or vice versa depending what is considered to be an active edge) when REFCLK is high when and HSCLK transitions from low to high. That is, REFCLK transitioning from low to high causes a corresponding transition in REF Trigger upon the next active edge of HSCLK. Similarly, the output signal 116 from the TDC trigger circuit 115 is designated as Feedback Trigger and transitions from low to high when FBCLK is high and when HSCLK transitions from low to high. That is, FBCLK transitioning from low to high causes a corresponding transition in Feedback Trigger upon the next active edge of HSCLK.

Logic gate 130 is shown in the example of FIG. 1 as being an exclusive-OR gate (and is referred to herein as exclusive-OR gate 130), but could be implemented as other logic gates or combinations of logic gates. The inputs of exclusive-OR gate 130 include the REF Trigger signal 111 and the Feedback Trigger signal 116. The output of the exclusive-OR gate 130 is provided to the synchronization circuit 133. The output of the exclusive-OR gate 130 is a logic high when one, but not both, of the REF Trigger and the Feedback Trigger signals 111 and 116 are logic high, that is, upon occurrence of the earliest rising edge of REFCLK or FBCLK.

The synchronization circuit 133 includes a D flip-flop 138 and an AND gate 140. The D flip-flop 138 includes a data input (D), a clock input and an output (Q). The output signal from the exclusive-OR gate 130 is provided to the D input of flip-flop 138. The HSCLK is provided to the clock input of the D flip-flop and the output Q is coupled to an input of AND gate 140. The other input of AND gate 140 also receives HSCLK. When the first of the active edge of REF Trigger 111 or Feedback Trigger 116 is received, the output of the exclusive-OR gate 130 becomes a logic high. Upon the next active edge of HSCLK, the logic high on the D input of flip-flop 138 is latched through to the output Q of the flip-flop, and, with HSCLK still being high causes the synchronization output signal 141 of the AND gate 140 to be high. The output of AND gate 140 represents the input to ripple counter 150.

In some examples, the ripple counter 150 is implemented as an asynchronous counter comprising multiple serially-connected flip-flops where an input flip-flop is clocked by an external clock, and each subsequent flip-flop is clocked by the output of the preceding flip-flop. The external clock that clocks the input flip-flop of ripple counter 150 is the synchronization output signal 141 from AND gate 140. The count output 151 of the ripple counter 150 is provided as an input to the TDC calculation circuit 155.

The TDC calculation circuit includes digital counter 158, flip-flops 160, 165, 170, 175, two's complement circuit 174, and a multiplexer 176. The digital counter 158 counts active edges of the output 151 from the ripple counter 150 and provides an output count value 159. The combination of ripple counter 150 and digital counter 158 represents a counter circuit.

Referring still to the example of FIG. 2, stop signal generation circuit 180 includes an AND gate 182, a delay element 184, and a D flip-flop 186. The inputs to AND gate 182 comprise the REF Trigger signal 111 and the Feedback Trigger signal 116 from the TDC trigger circuits 110 and 115, respectively. When both the REF Trigger signal 111 and the Feedback Trigger signal 116 are high, the output of AND gate 182 becomes a logic high. Both the REF Trigger signal 111 and the Feedback Trigger signal 116 being high represents the stop condition when the counting process should cease. The output of the AND gate 182 is latched into D flip-flop 186 upon occurrence of the next active edge of HSCLK. The Q output of D flip-flop 186 represents the STOP signal 187 and is provided to the TDC calculation circuit 155 and used to clock flip-flops 160 and 170. Flip-flop 160 latches in the count value 159 from the digital counter 158 upon occurrence of an active edge of the STOP signal 187. The FBCLK signal is then used to latch the count output of flip-flop 160 by flip-flop 165 to thereby synchronize the count value to the FBCLK.

The delay element 184 delays the output of AND gate 182 to provide a CLEAR signal 189. The CLEAR signal 189 is essentially a delayed version of the STOP signal 187 with enough of a delay to ensure that the CLEAR signal 189 is asserted high at a time that that the count value from the digital counter 158 has been fully latched through flip-flops 160 and 170. The CLEAR signal 189 is provided to the clear inputs of the flip-flop 138, the ripple counter 150, the digital counter 158, and flip-flops 120 and 125. The CLEAR signal 189 resets these components in preparation for the generation of a new count value from the ripple and digital counters 150 and 158.

Figure 3:
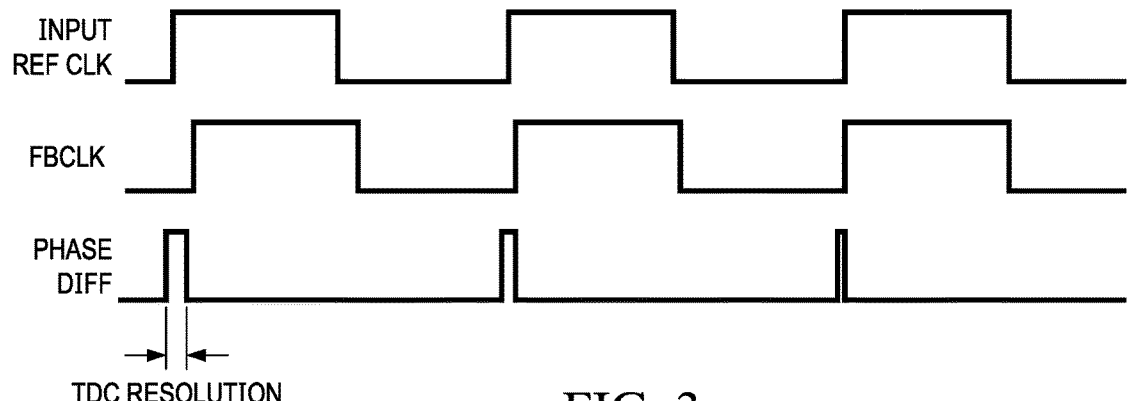
FIG. 3 illustrates a phase difference between an input reference clock and a feedback clock.
Figure 4:
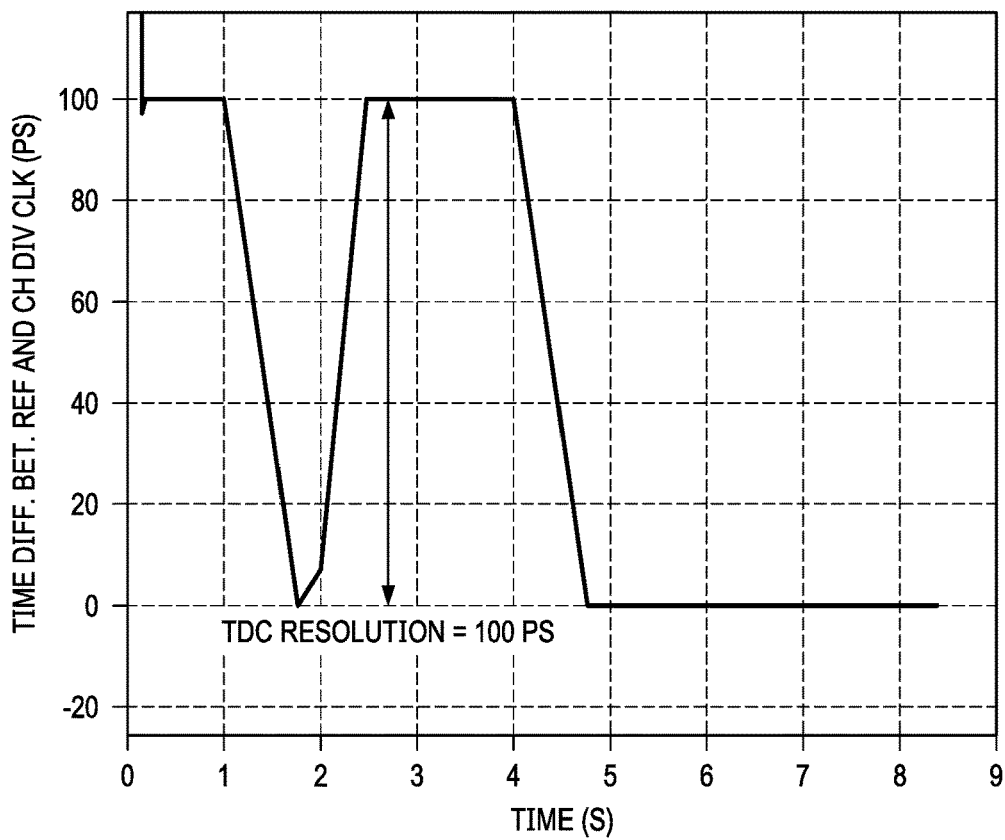
FIG. 4 illustrates wobble in the phase difference over time.

FIG. 3 shows several illustrative cycles of the input reference clock and FBCLK. The phase difference between the two clocks varies among the cycles as shown. The phase difference may be less than the resolution of the TDC circuit 102. FIG. 4 illustrates wobble back and forth between the resolution of the TDC (100 ps in this example) and 0 over time.

Figure 5:
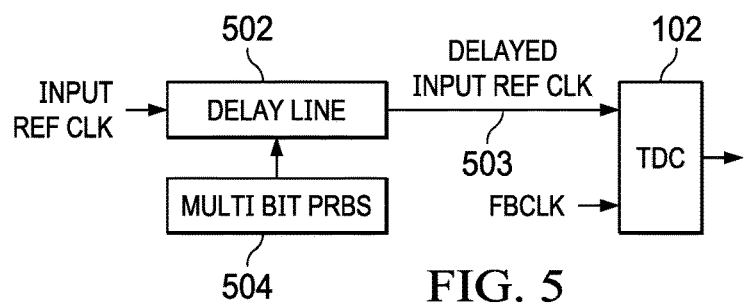
FIG. 5 shows an example in which a pseudo random time delay is added to the input reference clock.
Figure 6:
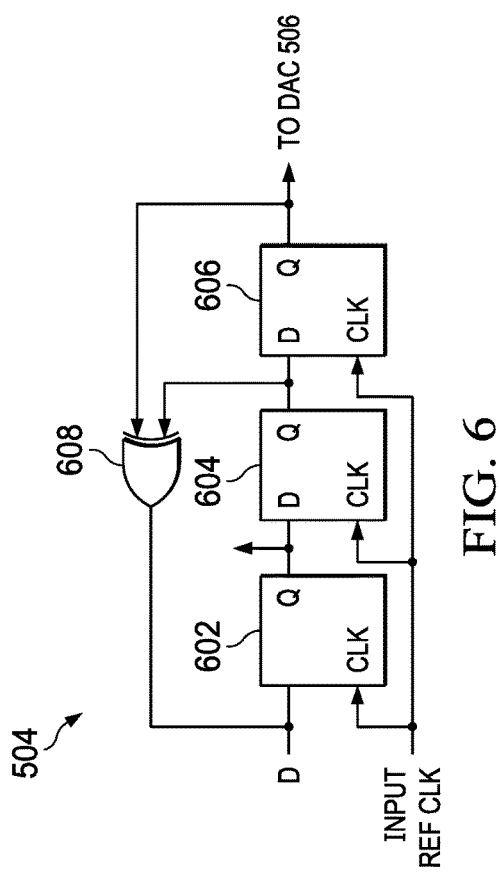
FIG. 6 shows an example circuit comprising a pseudo random binary sequence generator.

FIG. 5 shows an example circuit to reduce or eliminate the wobble of the phase difference. The illustrative circuit of FIG. 5 includes the TDC circuit 102, a programmable delay line 502, and a multi-bit pseudo random binary sequence (PRBS) generator 504. The combination of the programmable delay line 502 and the multi-bit PRBS generator 504 comprises the delay 101 of FIG. 1. The multi-bit PRBS generator 504 generates a binary sequence that, while generated with a deterministic algorithm, exhibits statistical behavior similar to a truly random sequence. FIG. 6 (discussed below) provides an example of a pseudo random PRBS generator. The binary sequence from the multi-bit PRBS generator 504 is then used to control the amount of delay in the delay line 502. The delay line 502 delays the rising and falling edges of the input reference clock by an amount of time that is based on the binary sequence from the multi-bit PRBS generator 504 to produce a delayed input reference clock 503. The TDC circuit 102 then determines the phase difference between the delayed version of the input reference clock (delayed input reference clock 503) and the FBCLK. Other circuits for generating a pseudo random value to be used to vary the amount of time delay are possible as well. The term "pseudo random" is broad enough to include precisely random (e.g., hardware-based true random number generators such as those based on ring oscillators) as well as approximately random.

FIG. 6 shows an example of the multi-bit PRBS generator 504. This example is a 7-bit PRBS generator that uses a 3-bit shift register comprising D flip-flops 602, 604, and 606. The Q output of flip-flop 602 is provided to the D input of flip-flop 604, and the Q output of flip-flop 604 is provided to the D input of flip-flop 606. The Q outputs of flip-flops 604 and 606 are provided to inputs of an exclusive-OR gate 608, the output of which is coupled to the D input of flip-flop 602. The PRBS generator 504 in this example generates a repeating binary sequence that has a length of $2^N-1$, where N is the number of bits (i.e., flip-flops). In the example of FIG. 6, N is 3 and thus the PRBS generator 504 of FIG. 6 generates a binary sequence of length $2^3-1$, or 7. The PRBS generator 504 of FIG. 6 can be scaled to include additional flip-flops as desired and thus increase the length of the binary sequence. In one example of a PRBS generator, the maximum number of 1's that are adjacent one another in each sequence will be N, whereas the maximum number of 0's adjacent one another are N−1. The time duration of each bit of the binary sequence is equal to the period of the input reference clock that clocks each of the flip-flops 602-606.

Figure 7:
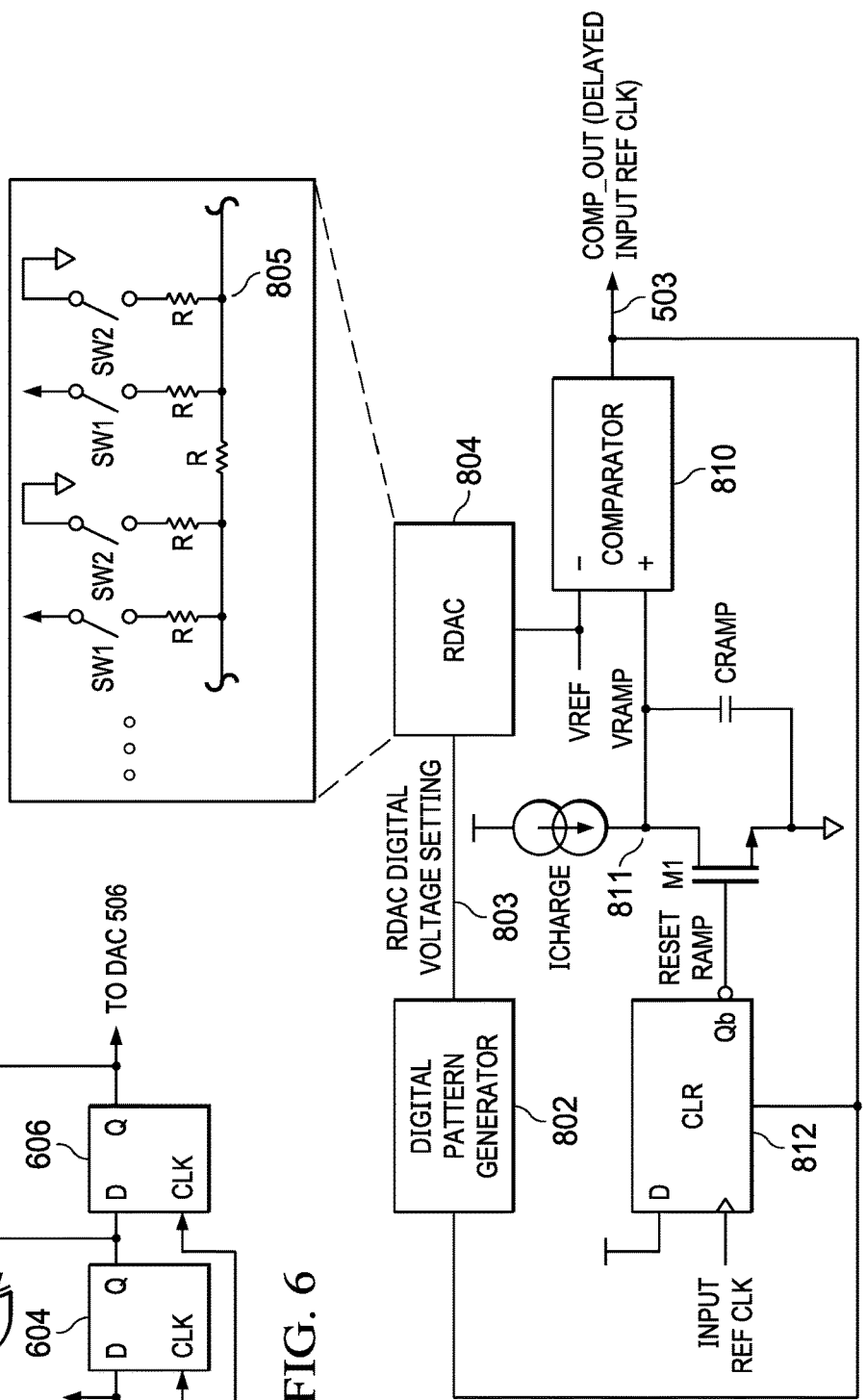
FIG. 7 shows an example implementation of a circuit to introduce pseudo random delay to an input reference clock.

FIG. 7 shows an example circuit in which a pseudo random delay is added to the input reference clock. The example circuit of FIG. 7 includes a digital pattern generator 802, a resistive DAC (RDAC) 804, a comparator 810, a D flip-flop (DFF) 812, a transistor switch M1, a current source Icharge ("Icharge" refers to both the current source circuit and the magnitude of current sourced therefrom), and a capacitor Cramp. The current source Icharge couples to Cramp at node 811 and to the drain of M1 (M1 is an n-type metal oxide semiconductor transistor, nMOS device, in this example. The other terminal of Cramp and the source of M1 are connected together and to the ground node. The gate of M1 is driven by the Qbar (Qb) output of DFF 812. The signal generated by the Qb output of the DFF 812 is designated Reset Ramp. The voltage on node 811 is designated VRAMP.

The comparator 810 comprises a voltage comparator that produces a comparator output (COMP_OUT) signal based on the relationship between its positive input (which receives VRAMP) and its negative input (which receives a VREF signal from RDAC 804). The COMP_OUT from the comparator 810 is provided as the delayed input reference clock 503 to the TDC 102. COMP_OUT is also coupled to the clear (CLR) input of the DFF 812 and, when high, clears the DFF which forces Qb to be a logic high. The D input of the DFF 812 is tied to a VDD and its clock input receives the input reference clock to be delayed. COMP_OUT also is used to clock the digital pattern generator 802. In one example, the digital pattern generator 802 generates a multi-bit pseudo random binary sequence 803 to the RDAC 804.

FIG. 7 also shows an example of an RDAC 804 as a pair of switches SW1 and SW2 operated by each bit of the multi-bit pseudo-random binary sequence 803. For example, a given bit being high causes SW1 to close and SW2 to open and for the same bit being low, SW1 opens and SW2 closes. Each switch SW1/SW2 couples to a resistor R as shown, another resistor R interconnects each SW1/SW2 switch pair to the adjacent switch pairs in the RDAC 804. Switches SW1 are connected to VDD and switches SW2 are connected to ground. RDAC 804 is a dynamically configurable resistor network in which the interconnection of the resistors is determined by the pseudo random binary sequence. The resulting analog voltage on the output node 805 is thus a function of the pseudo random binary sequence, the resistance of resistors R, and the magnitude of VDD. The output voltage from the RDAC 804 (VREF) is provided to the negative input of the comparator 810. The output of comparator will be high when VRAMP is greater than VREF, otherwise the comparator output (COMP_OUT) will be low.

Figure 8:
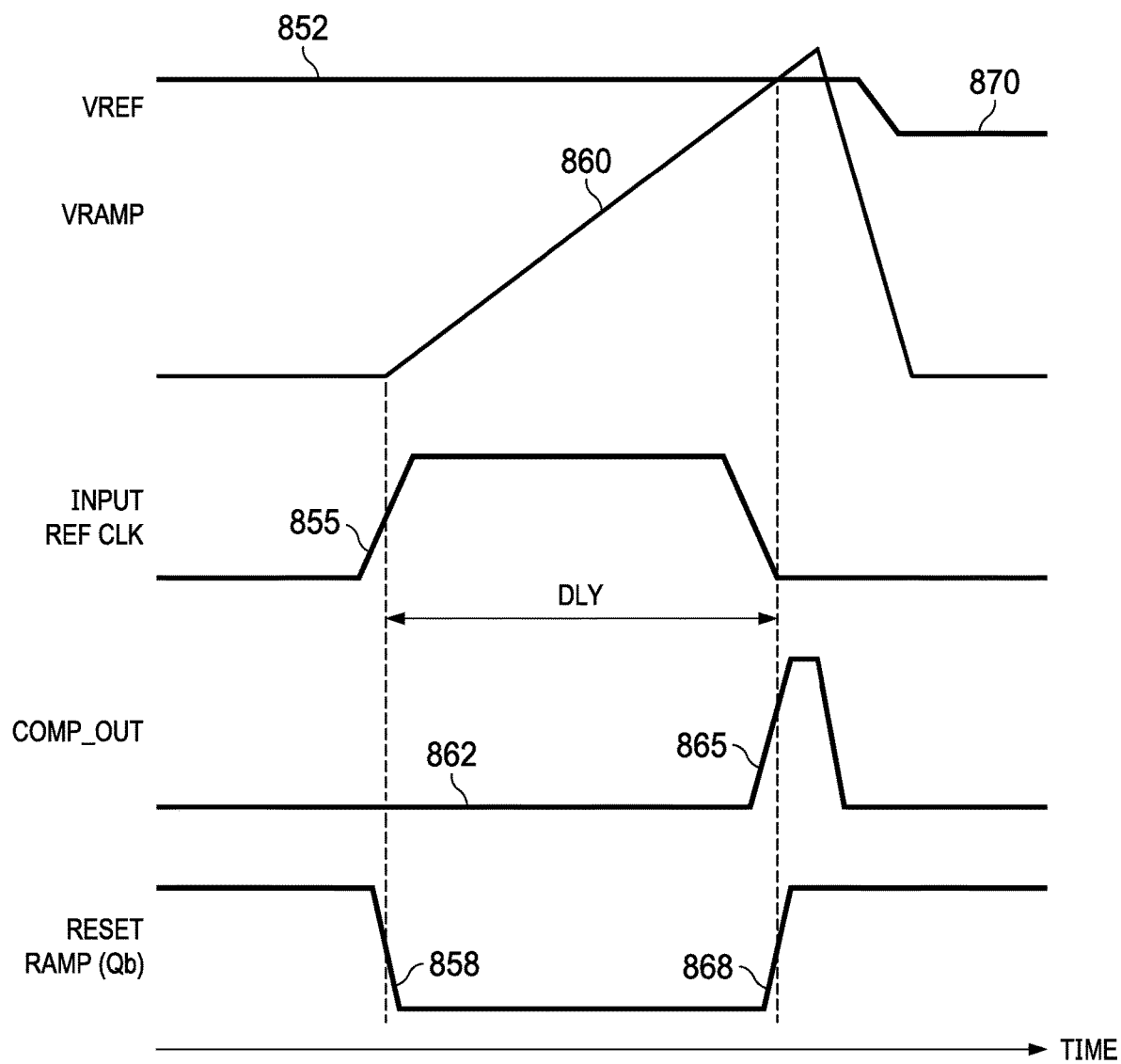
FIG. 8 is a timing diagram corresponding to the example circuit of FIG. 7

FIG. 8 includes a timing diagram to illustrate the operation of the circuit of FIG. 7. The signals depicted include VREF, VRAMP, input reference clock, COMP_OUT, and Reset Ramp. The voltage level of VREF (output of RDAC 804) is shown at 852 to be a voltage corresponding to the present pseudo random binary sequence of the digital pattern generator 802. Upon occurrence of the next rising edge of the input reference clock at 855, the DFF 812 is clocked and Reset Ramp (Qb) is forced low as shown at 858. With Reset Ramp being low, M1 is turned off and Icharge current is permitted to the positive plate of Cramp thereby causing VRAMP to increase linearly as shown at 860. The slope of VRAMP is a function of the ration of Icharge to Cramp. The combination of M1, Icharge, and Cramp comprises a ramp generator circuit.

With VRAMP being lower than the VREF, COMP_OUT is low as shown at 862. When VRAMP crosses VREF and is thus greater than VREF, COMP_OUT transitions from low to high as shown at 865. Once COMP_OUT becomes high, the DFF 812 (whose CLR input is connected to COMP_OUT) is cleared which then forces Qb high as well (868). The rising edge 865 of COMP_OUT also clocks the digital pattern generator 802 to generate the next pseudo random binary sequence which is then converted to a different analog voltage for VREF as shown at 870. The process then repeats upon the next rising edge of the input reference clock.

The time delay (DLY) between the rising edge 855 of the input reference clock and the subsequent rising edge 865 of COMP_OUT is the time delay introduced into the input reference clock for the TDC 102. The magnitude of DLY is a function of the propagation delay through DFF 812, the slope of VRAMP (which itself is a function of Icharge/Cramp), the propagation delay through the comparator 810.

Figure 9:
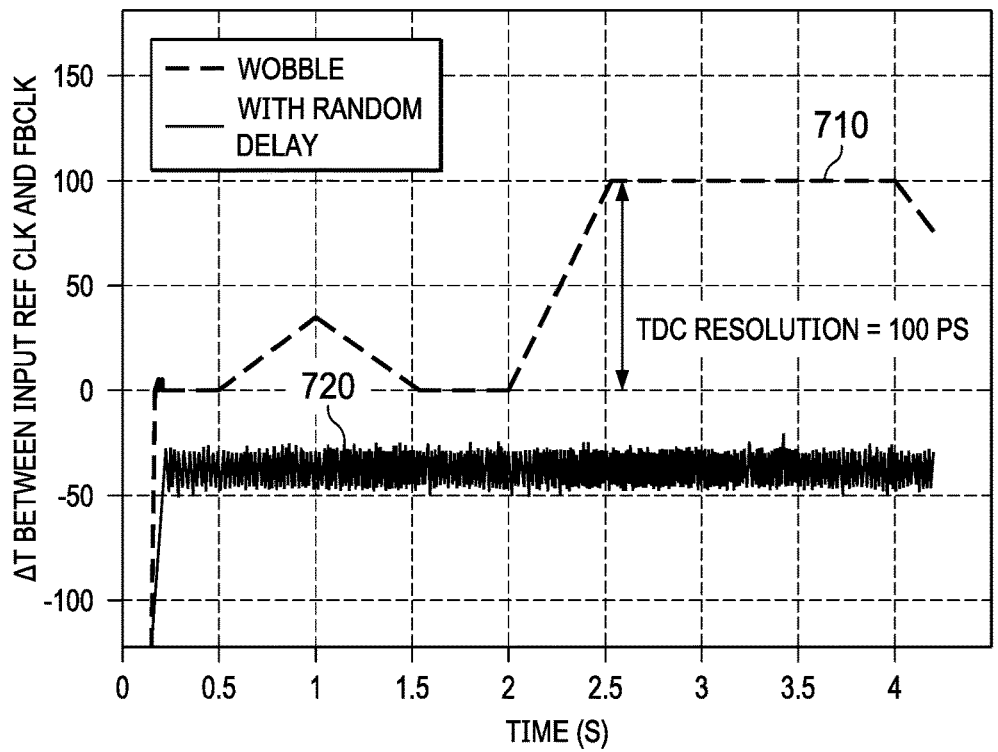
FIG. 9 illustrates the benefit of introducing pseudo random delay to the input reference clock.

FIG. 9 illustrates the effect of introducing a pseudo random delay to the input reference clock. FIG. 9 shows two graphs 710 and 720. Each graph plots the time difference between the input reference clock and the feedback clock (FBCLK) over time. Graph 710 shows the time difference without the introduction of the pseudo random delay. As discussed above, the measured time difference wobbles between 100 ps (or whatever the resolution is of the TDC) and 0. Graph 720 shows the time difference with the pseudo random delay included. As shown in this example, the time difference averages out to a constant value of about −35 ps. Wobble has been eliminated from the TDC by the introduction of a pseudo random delay to the input reference clock.

Figure 10:
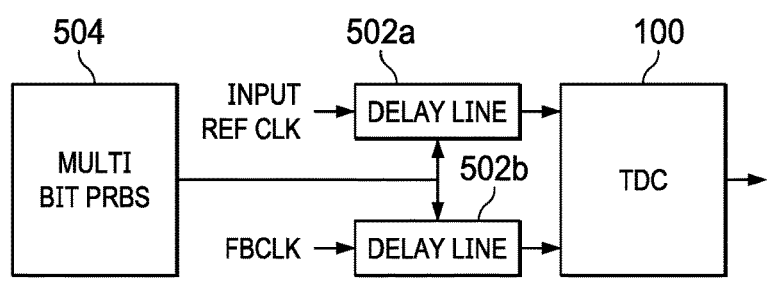
FIG. 10 illustrates the introducing of pseudo random delay to both the input reference clock and the feedback clock.

In FIGS. 5 and 7, a pseudo random delay was added to the input reference clock but not FBCLK. In the example of FIG. 10, a pseudo random delay is added to both input reference clock and FBCLK. The input reference clock is delayed via delay line 502a and FBCLK is delayed via delay line 502b. The same binary sequence from the multi-bit PRBS 504 is used to vary by the same amount the delay introduced to both clock signals. The benefit of the architecture of FIG. 10 is that noise that is otherwise introduced by adding the delay line in only one of the paths (REFCLK in FIG. 5) can be cancelled by using two delay lines for the clocks—input reference clock and FBCLK.

In this description, the term "couple" or "couples" means either an indirect or direct connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors. Modifications are possible in the described embodiments, and other embodiments are possible, within the scope of the claims.

What is claimed is:
1. A circuit, comprising:
   a time-to-digital converter (TDC) to produce an output signal that is a function of a time difference between a first input clock to the TDC and a second input clock to the TDC;
   a first delay line to add a time delay to a third clock to produce the first input clock; and a pseudo random binary sequence generator to generate a pseudo random binary bit sequence to be used to vary the amount of time delay added by the first delay line to the third clock.

2. The circuit of claim 1, wherein the first delay line includes a comparator and a ramp generator circuit.

3. The circuit of claim 1, wherein the first delay line includes a resistive digital-to-analog converter (RDAC) a comparator, and ramp generator circuit, and a flip-flop.

4. The circuit of claim 3, wherein the ramp generator circuit includes a current source device, a capacitor and a transistor switch, the transistor connected in parallel to the capacitor.

5. The circuit of claim 3, wherein the flip-flop includes a clock input that is coupled to an output of the comparator, and the flip-flop also includes a data input that is coupled to receive the third clock.

6. The circuit of claim 5, wherein the flip-flop includes an output that is coupled to the ramp generator circuit.

7. The circuit of claim 1, wherein:
the first delay line includes a resistive digital-to-analog converter (RDAC), a comparator and a ramp generator circuit;
the RDAC is coupled to an input of the comparator; and
the RDAC is to generate an analog voltage based on the pseudo random binary bit sequence.

8. The circuit of claim 7, wherein the ramp generator circuit is coupled to another input of the comparator, and the ramp generator is to generate a ramp signal responsive to an edge of the third clock.

9. The circuit of claim 1, further comprising a second delay line to add a delay to the second clock.

10. The circuit of claim 9, wherein the pseudo random binary bit sequence from the pseudo random binary sequence generator is to be used to vary the amount of time delay added by the second delay line to the second clock.

11. A digital phase-locked loop (DPLL), comprising:
an analog phase-lock loop to generate an output clock;
a time-digital converter (TDC) to produce an output signal that is a function of a time difference between an input reference clock and clock derived from the output clock;
a filter coupled to the TDC to filter an output signal from the TDC;
a first delay line to add a time delay to a third clock to produce the first input clock; and
a pseudo random binary sequence generator to generate a pseudo random binary bit sequence to be used to vary the amount of time delay added by the first delay line to the third clock.

12. The DPLL of claim 11, wherein the first delay line includes a comparator and a ramp generator circuit.

13. The DPLL of claim 11, wherein the first delay line includes a resistive digital-to-analog converter (RDAC), a comparator, and ramp generator circuit, and a flip-flop.

14. The DPLL of claim 13, wherein the flip-flop includes a clock input that is coupled to an output of the comparator, and the flip-flop also includes a data input that is coupled to receive the third clock.

15. The DPLL of claim 11, wherein:
the first delay line includes a resistive digital-to-analog converter (RDAC), a comparator and a ramp generator circuit;
the RDAC is coupled to an input of the comparator; and
the RDAC is to generate an analog voltage based on the pseudo random binary bit sequence.

16. The DPLL of claim 15, wherein the ramp generator circuit is coupled to another input of the comparator, and the ramp generator is to generate a ramp signal responsive to an edge of the third clock.

17. The DPLL of claim 11, further comprising a second delay line to add a delay to the second clock.

18. The DPLL of claim 17, wherein the pseudo random binary bit sequence from the pseudo random binary sequence generator is to be used to vary the amount of time delay added by the second delay line to the second clock.

19. A circuit, comprising:
a time-to-digital converter (TDC) to produce an output signal that is a function of a time difference between a first input clock to the TDC and a second input clock to the TDC;
a first delay line to add a time delay to a third clock to produce the first input clock;
a second delay line to add a time delay to a fourth clock to produce the second clock; and
a circuit to generate a pseudo random value to be used to vary the amount of time delay added by the first delay line to the third clock and by the second delay line to the fourth clock.

20. The circuit of claim 19, wherein the circuit to generate the pseudo random value comprises a multi-bit pseudo random binary sequence generator circuit.

* * * * *